(12) United States Patent
Ko

(10) Patent No.: US 7,539,074 B2
(45) Date of Patent: May 26, 2009

(54) PROTECTION CIRCUIT WITH ANTIFUSE CONFIGURED AS SEMICONDUCTOR MEMORY REDUNDANCY CIRCUITRY

(75) Inventor: Sang-Gi Ko, Gyeonggi-do (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 167 days.

(21) Appl. No.: 11/800,635

(22) Filed: May 7, 2007

(65) Prior Publication Data

US 2008/0043557 A1 Feb. 21, 2008

(30) Foreign Application Priority Data

Jul. 10, 2006 (KR) ...................... 10-2006-0064626

(51) Int. Cl.
*G11C 17/16* (2006.01)
(52) U.S. Cl. ............... 365/225.7; 365/200; 365/230.08; 365/189.06; 365/228
(58) Field of Classification Search ............. 365/227.7, 365/230.08, 200, 201, 189.06, 228
See application file for complete search history.

(56) References Cited

U.S. PATENT DOCUMENTS

| | | | |
|---|---|---|---|
| 5,796,656 A | * | 8/1998 | Kowshik et al. ........ 365/185.23 |
| 6,128,241 A | | 10/2000 | Choi |
| 6,545,926 B2 | | 4/2003 | Ooishi et al. |
| 2008/0043557 A1 | * | 2/2008 | Ko ......................... 365/225.7 |

FOREIGN PATENT DOCUMENTS

| | | |
|---|---|---|
| JP | 2000-011684 A | 1/2000 |
| JP | 2000-200498 | 7/2000 |
| JP | 2005-323377 A | 11/2005 |
| KR | 10-2002-0082370 | 10/2002 |
| KR | 1020040059776 A | 7/2004 |
| KR | 1020060060917 A | 6/2006 |

OTHER PUBLICATIONS

Notice of Allowability for Korean Patent Application No. 9-5-2007-032388502; Jun. 13, 2007.

* cited by examiner

*Primary Examiner*—Andrew Q Tran
(74) *Attorney, Agent, or Firm*—Myers Bigel Sibley & Sajovec, P.A.

(57) ABSTRACT

A semiconductor device includes a fuse part including an antifuse that is connected between a first common node to which a high voltage that is higher than an internal boost voltage is applied and a first node. The fuse part is enabled in response to a program mode selection signal and an address signal so as to fuse the antifuse in response to the high voltage applied to the first common node and to set a voltage level of a second node. A latch circuit is configured to latch an output signal responsive to the voltage level of the second node when the fuse part is in a fused state. A protection circuit is configured to lower a voltage level at the first node when the fuse part is not enabled and the high voltage is applied to the first common node.

14 Claims, 4 Drawing Sheets

PROTECTION CIRCUIT WITH ANTIFUSE CONFIGURED AS SEMICONDUCTOR MEMORY REDUNDANCY CIRCUITRY

CROSS-REFERENCE TO RELATED APPLICATION

This application claims the benefit of Korean Patent Application No. 2006-0064626, filed Jul. 10, 2006, the disclosure of which is hereby incorporated herein by reference in its entirety.

BACKGROUND OF THE INVENTION

1. Field of the Invention

The present invention relates to semiconductor devices, and, more particularly, to semiconductor devices that include a fuse part including an antifuse circuit and a protection circuit.

2. Description of the Related Art

In semiconductor devices, such as memory devices, when even a single unit cell includes a defect that causes the cell to function improperly, the device may be regarded as defective. However, it may be counterproductive to discard the whole device due to only a few defective cells. Accordingly, defective cells in a memory device may now be replaced with pre-fabricated redundancy cells to save the device. As a result, yield may increase and production cost may decrease.

A repair procedure using redundancy cells may be performed by fabricating redundancy rows and redundancy columns for a cell array beforehand, and replacing a defective row or column of a memory cell with a redundancy row or column. For example, when a defective memory cell is detected through testing after wafer processing is completed, a program may be executed in an internal circuit to replace an address of the defective cell with an address of a redundancy cell. Accordingly, when an address signal corresponding to a defective line is input during operation of the semiconductor memory device, the device accesses a spare line instead of the defective line.

A typical repair procedure involves the use of a fuse, in which a fuse is disposed in an internal circuit for performing a repair, and a row or column having a defective cell is replaced with a redundancy row or column by a technique of melting a fuse on a line connected to the defective row or column by overcurrent, a technique of cutting the fuse with a laser beam, a technique of connecting a junction with a laser beam, or a technique of programming the cell as an EPROM, etc. Among these techniques, the technique of cutting a fuse with a laser beam has been widely used because of its simplicity, reliability, and low probability of programming error. In this technique, a fuse having a polysilicon or metal interconnection may be used. However, the method of repairing a semiconductor device using a fuse is typically carried out in a wafer state and may not be applied when a cell proves to be defective after packaging is completed. To overcome this limitation, a method of using an antifuse has been developed.

Antifuses can be simply programmed for repairing defects in the packaging procedure. In general, an antifuse device has an opposite electrical characteristic to a fuse device. That is, the antifuse is generally a resistant fuse device that has high resistance (e.g., 100 MΩ) in an unprogrammed state and low resistance (i.e., 100 kΩ or less) after a programming operation. An antifuse device is generally made of thin dielectric materials, such as a complex in which a dielectric, for example, silicon dioxide ($SiO_2$), silicon nitride, tantalum oxide, or silicon dioxide-silicon nitride-silicon dioxide (ONO), is inserted between two conductors. The antifuse is programmed by destroying the dielectric between the conductors by applying a high voltage (e.g., 10V) across terminals of the antifuse for a long-enough time. Therefore, when the antifuse is programmed, the conductors at both ends thereof are shorted, and its resistance is reduced.

A typical repair circuit that includes an antifuse has a structure such as that illustrated in FIG. 1, comprising: an antifuse circuit part 10 that includes a plurality of antifuse circuits that receive a program mode selection signal SEL for identifying a programming mode in which the antifuse is fused, and an address signal ADDR for selecting a certain antifuse to be fused; a power-up signal generator 20 that outputs to the antifuse circuit part 10 a power-up signal PRECH for detecting power stabilization after application of power to a chip; a high voltage generator 30 that fuses the selected antifuse by applying a high voltage to the antifuse circuit part 10; and a redundancy circuit 40 that activates a redundancy cell in response to a redundancy signal RD output from the antifuse circuit part 10.

FIG. 2 illustrates the antifuse circuit part 10 of the repair circuit illustrated in FIG. 1 according to a conventional implementation. Although FIG. 2 illustrates two antifuse circuits 11 and 12 connected to a pad PAD that receive a high voltage generated by a high voltage generator 30 of FIG. 1, in general, a plurality of antifuse circuits 11 and 12 corresponding to one row or column are connected to the pad PAD.

However, in the antifuse circuits 11 and 12 having such a configuration, when the high voltage is applied to the pad PAD to fuse one of the antifuse circuits, a gate dielectric layer of a transistor forming another of the antifuse circuits 11 and 12 connected together to the pad PAD may be damaged. This will now be described in more detail with reference to FIG. 2.

For example, suppose that only a first antifuse FUSE1 of a first antifuse circuit 11 is to be fused. The antifuse circuits 11 and 12 may have NMOS transistors N11 and N21 as a switch part, one end of which is a fuse part and the other end of which is a latch part.

The NMOS transistors N11 and N21 of the switch part switch between fuse nodes Node11 and Node21 and latch nodes Node12 and Node22 in response to a power-up signal PRECH. The power-up signal PRECH is produced using a power voltage Vcc. At the beginning of power application, the power-up signal PRECH increases as the power voltage Vcc increases, and when the power voltage Vcc reaches a certain level, the power-up signal PRECH is maintained at the same level as the power voltage Vcc for a predetermined time. Accordingly, when the power voltage Vcc is applied, the power-up signal PRECH increases and then is maintained at a fixed level for a predetermined time, and, thus, current may flow from the latch nodes Node12 and Node22 to the fuse nodes Node11 and Node21.

A program mode selection signal SEL and address signals ADDR1 and ADDR2 are applied to the fuse part. A semiconductor memory device activates the program mode selection signal SEL to perform a repair procedure after a defective memory cell is detected through testing. The program mode selection signal SEL may be applied to the plurality of antifuse circuits 11 and 12 at the same time so as to perform programming operations. Meanwhile, the semiconductor memory device activates the address signal ADDR1 of the antifuse circuit 11 corresponding to the defective memory cell detected by the testing. That is, the program mode selection signal SEL is activated during the programming operation and applied to all antifuse circuits 11 and 12, and the address signals ADDR1 and ADDR2 are selectively activated to choose only the antifuse circuit to be programmed among the plurality of antifuse circuits 11 and 12.

In the programming operation, the program mode selection signal SEL is activated, as is the first address signal ADDR1, because the first antifuse FUSE1 is to be fused; however the second address signal ADDR2 is not activated because no fusing is to be performed there. In this case, an activated signal may have a logic high level.

The high level program mode selection signal SEL and first address signal ADDR1 are input to a NAND gate NAND1 which, in response, outputs a low level signal. This low level signal is then input to a first inverter INV1 that outputs a high level signal, which is applied to a gate terminal of an NMOS transistor N12. The NMOS transistor N12 is turned on in response to the high level signal. Because the second address signal ADDR2 is applied at a low level, a low level signal is applied to a gate terminal of an NMOS transistor N22, which is consequently turned off.

In the meantime, when a high voltage Vf is applied from the high voltage generator 30 of FIG. 1 to the pad PAD, the high voltage is applied to one end of all antifuses FUSE1 and FUSE2 connected with the pad PAD. In addition, the NMOS transistor N12 is turned on by the program mode selection signal SEL and the first address signal ADDR1, and an NMOS transistor N13 is always turned on because a boost voltage Vpp is applied to a gate terminal. Thus, an A node NodeA is brought to a ground voltage Vss and a high voltage is applied between both ends of the first antifuse FUSE1 fusing the first antifuse FUSE1. An NMOS transistor N22 of a second antifuse circuit 12 is turned off responsive to the low level second address signal ADDR2 so that a voltage applied between both ends of the second antifuse FUSE2 is not high and, thus, the second antifuse FUSE2 is not fused. The high voltage Vf is applied to the pad PAD during a fusing operation, and the ground voltage Vss is applied to the pad PAD when the fusing operation is not performed.

NMOS transistors N13 and N23 interconnected between the fuse node Node11 and the A node NodeA, and between the fuse node Node21 and a B node NodeB may function to prevent or reduce damage to gate oxide layers of the transistors included in each of the antifuse circuits 11 and 12, even if the high voltage is applied to the pad PAD in programming.

As described above, in the antifuse circuits 11 and 12 in which the first antifuse FUSE1 is fused and the second antifuse FUSE2 is not fused, the latch part precharges the latch nodes Node21 and Node22 with the power voltage Vcc and, in turn, latches the voltage thereof.

As the power voltage Vcc increases at the beginning of power application, the latch part precharges the latch nodes Node21 and Node22. A power stabilization signal VCCH is maintained at a "low" level during the increase in the power voltage Vcc, and when the power voltage Vcc reaches a certain level and is maintained, the power stabilization signal VCCH transitions to a "high" level. Upon initial application of power, the power stabilization signal VCCH is at a low level so that a current path is formed by PMOS transistors P11, P21, P12 and P22. Also, the power-up signal PRECH increases as the power voltage Vcc increases, and, thus, current flows toward the fuse nodes Node11 and Node21 through the PMOS transistors P11, P21 P12 and P22 and the NMOS transistors N11 and N21. Gate terminals of the NMOS transistors N13 and N23 are connected to a boost voltage Vpp, and, thus, current flows to the antifuses FUSE1 and FUSE2.

The first antifuse FUSE1 of the first antifuse circuit 11 is fused so as to have small resistance, and, thus, current through the fuse node Node11 flows to the pad PAD through the first antifuse FUSE1 so that a voltage of the fuse node Node11 does not increase beyond a predetermined level. The NMOS transistor N11 connects the fuse node Node11 and the latch node Node12 in response to the power-up signal PRECH, and, thus, the voltage of the latch node Node12 decreases according to the voltage of the fuse node Node11. When the power voltage Vcc is stable, the power stabilization signal VCCH transitions to a high level, the PMOS transistor P12 is turned off, and an NMOS transistor N14 is turned on. As the voltage of the latch node Node12 decreases, a second inverter INV12 outputs a high level signal, and, thus, an NMOS transistor N15 is turned on and the PMOS transistor P13 is turned off. Thus, the voltage of the latch node Node12 is stabilized at a low level. Because the NMOS transistor N14 is turned on, it can be seen that the second inverter INV12, the PMOS transistor P13, and the NMOS transistor N15 constitute a latch circuit.

The second antifuse FUSE2 of the second antifuse circuit 12 is not fused and, thus, has a large resistance so that the current through the fuse node Node 21 does not flow to the pad PAD through the second antifuse FUSE2. Accordingly, the voltage at the fuse node Node21 increases. The NMOS transistor N21 connects the fuse node Node21 and the latch node Node22 in response to the power-up signal PRECH, and, thus, the voltage of the latch node Node22 increases according to the voltage of the fuse node Node21. When the power voltage Vcc is stable, the power stabilization signal VCCH transitions to a high level, the PMOS transistor P22 is turned off, and an NMOS transistor N24 is turned on. As the voltage of the latch node Node22 increases, a second inverter INV22 outputs a low level signal, and, thus, an NMOS transistor N25 is turned off and the PMOS transistor P23 is turned on. As a result, the voltage at the latch node Node22 is stabilized at a high level. Because the NMOS transistor N24 is turned on, it can be seen that the second inverter INV22, the PMOS transistor P23, and the NMOS transistor N25 constitute a latch circuit.

When the antifuse FUSE1 of the antifuse circuit 11 is fused and the antifuse FUSE2 of the second antifuse circuit 12 is not fused by the programming operation, the first antifuse circuit 11 outputs a high level redundancy signal RD1 and the second antifuse circuit 12 outputs a low level redundancy signal RD2.

When the high voltage Vf is applied from the high voltage generator 30 through the pad PAD to the first antifuse FUSE1 of the first antifuse circuit 11 in the programming operation, the high voltage Vf is applied to one end of the second antifuse FUSE2 of the second antifuse circuit 12 as well as the first antifuse circuit 11, but the NMOS transistor N22 in the second antifuse circuit 12 is not turned on. As a result, the B node NodeB is in a floating state and its voltage level increases from an initial value Vcc-Vth due to a coupling effect. The increase in voltage level is given by the following Formula 1 in terms of the capacitance Cnode of the NodeB, the capacitance Cfuse of the second antifuse FUSE2 and the pad PAD:

$$\frac{C_{fuse}}{C_{fuse} + C_{node}} \times V_f \qquad \text{[FORMULA 1]}$$

In the conventional art, when the voltage of the B node NodeB increases, a relatively high load is applied to a gate oxide layer of the NMOS transistor N23 adjacent to the B node NodeB due to the coupling effect. As a result, the gate oxide layer of the NMOS transistor N23 may sustain damage, such as cracks, or be destroyed.

SUMMARY OF THE INVENTION

According to some embodiments of the present invention, a semiconductor device includes a fuse part including an antifuse that is connected between a first common node to which a high voltage that is higher than an internal boost voltage is applied and a first node. The fuse part is enabled in response to a program mode selection signal and an address signal so as to fuse the antifuse in response to the high voltage applied to the first common node and to set a voltage level of a second node. A latch circuit is configured to latch an output signal responsive to the voltage level of the second node when the fuse part is in a fused state. A protection circuit is configured to lower a voltage level at the first node when the fuse part is not enabled and the high voltage is applied to the first common node.

In other embodiments, a pad connected to the first common node to receive the high voltage.

In still other embodiments, the fuse part includes a first NMOS transistor connected between the second node and the second common node, the first NMOS transistor being enabled responsive to the program mode selection signal and the address signal. An antifuse is configured to connect the first common node and the first node responsive to the high voltage applied to the first common node and enabled first NMOS transistor. A first NMOS transistor is connected between the first and second nodes, that is configured to transmit voltages up to a first predetermined voltage level when the internal boost voltage is applied to a gate terminal thereof.

In still other embodiments, the protection circuit is a third NMOS transistor having source and gate terminals connected to the second common node and a drain terminal connected to the first node and is operable to enter a punch-through breakdown state responsive to a voltage exceeding a second predetermined voltage level applied to the drain terminal.

In still other embodiments, the latch circuit includes a switch transistor that connects the second node and a third node responsive to a power-up signal and a latch part that is configured to latch the output signal responsive to a power stabilization signal and a voltage level at the third node.

In still other embodiments, a voltage level of the power-up signal increases according to a level of an applied power voltage, and the voltage level of the power-up signal is maintained at a high level for a time period when the power voltage stabilizes and then transitions to a low level.

In still other embodiments, the latch part further includes an activation part including a first PMOS transistor and a fourth NMOS transistor connected at the third node in series, which activate the latch part responsive to the power stabilization signal, an inverter that generates the output signal at an output node by logically inverting the voltage level at the third node, and an output latch part comprising a second PMOS transistor and a fifth NMOS transistor having respective gate terminals connected to the output node and receiving the output signal at their gates and latch the output signal together with the inverter.

In still other embodiments, the power stabilization signal transitions to a high level responsive to the applied power voltage.

In further embodiments, a semiconductor memory device includes a memory cell array that includes memory cells connected between a plurality of word lines and a plurality of bit lines, a redundancy memory cell array that includes redundancy memory cells connected between a plurality of redundancy word lines and a plurality of redundancy bit lines, a plurality of fuse circuit parts including an antifuse connected between a first common node to which a high voltage that is higher than an internal boost voltage is applied and a first node, each of the fuse circuit parts being enabled in response to a program mode selection signal and an address signal so as to fuse the respective antifuse in response to the high voltage applied to the common node and to set a voltage level of a second node, each of the fuse circuit parts being further enabled to output a redundancy signal in response to the voltage level of the second node, a plurality of protection circuits associated with the plurality of fuse circuit parts, respectively, each of the protection circuits being configured to lower a voltage level at the first node when the fuse circuit part is not enabled and the high voltage is applied to the first common node, a redundancy circuit part that is configured to select a corresponding redundancy word line or redundancy bit line of the redundancy memory cell array responsive to the address signal and the redundancy signal, and to output a redundancy enable signal, and a decoder that is configured to select a corresponding word line or bit line of the memory cell array responsive to the address signal, and being disabled responsive to the redundancy enable signal.

In still further embodiments, a pad is connected to the first common node to receive the high voltage.

In still further embodiments, the fuse circuit part includes a fuse part including an antifuse, that is configured to connect the first node and a second common node response to the program mode selection signal and the address signal, and a latch part that is configured to latch and output a redundancy signal responsive to the voltage level of the second node.

In still further embodiments, the fuse part includes a first NMOS transistor connected between the second node and the second common node and the first NMOS transistor being enabled responsive to the program mode selection signal and the address signal, an antifuse that is configured to connect the first common node and the first node responsive to the high voltage applied to the first common node and the enabled first NMOS transistor, and a second NMOS transistor connected between the first and second nodes that is configured to transmit voltages up to a first predetermined voltage level when the internal boost voltage is applied to a gate terminal thereof.

In still further embodiments, each of the protection circuits includes a third NMOS transistor having source and gate terminals connected to the second common node and a drain terminal connected to the first node, and is operable to enter a punch-through breakdown state responsive to a voltage exceeding a second predetermined voltage level applied to the drain terminal.

In still further embodiments, a plurality of sense amplifiers is connected to the plurality of bit lines and/or the plurality of redundancy bit lines configured to sense and amplify data of the memory cells and/or the redundancy memory cells, and a data input/output part is configured to output the data received from the plurality of sense amplifiers responsive to a read signal, and configured to input data to the plurality of sense amplifiers responsive to a write signal.

BRIEF DESCRIPTION OF THE DRAWINGS

The foregoing and other objects, features and advantages of the invention will be apparent from the more particular description of exemplary embodiments of the invention, as illustrated in the accompanying drawings. The drawings are

DETAILED DESCRIPTION OF EMBODIMENTS OF THE INVENTION

An antifuse circuit and a semiconductor memory device that uses the same, according to some embodiments of the present invention, will now be described more fully hereinafter with reference to the accompanying drawings.

Figure 2:
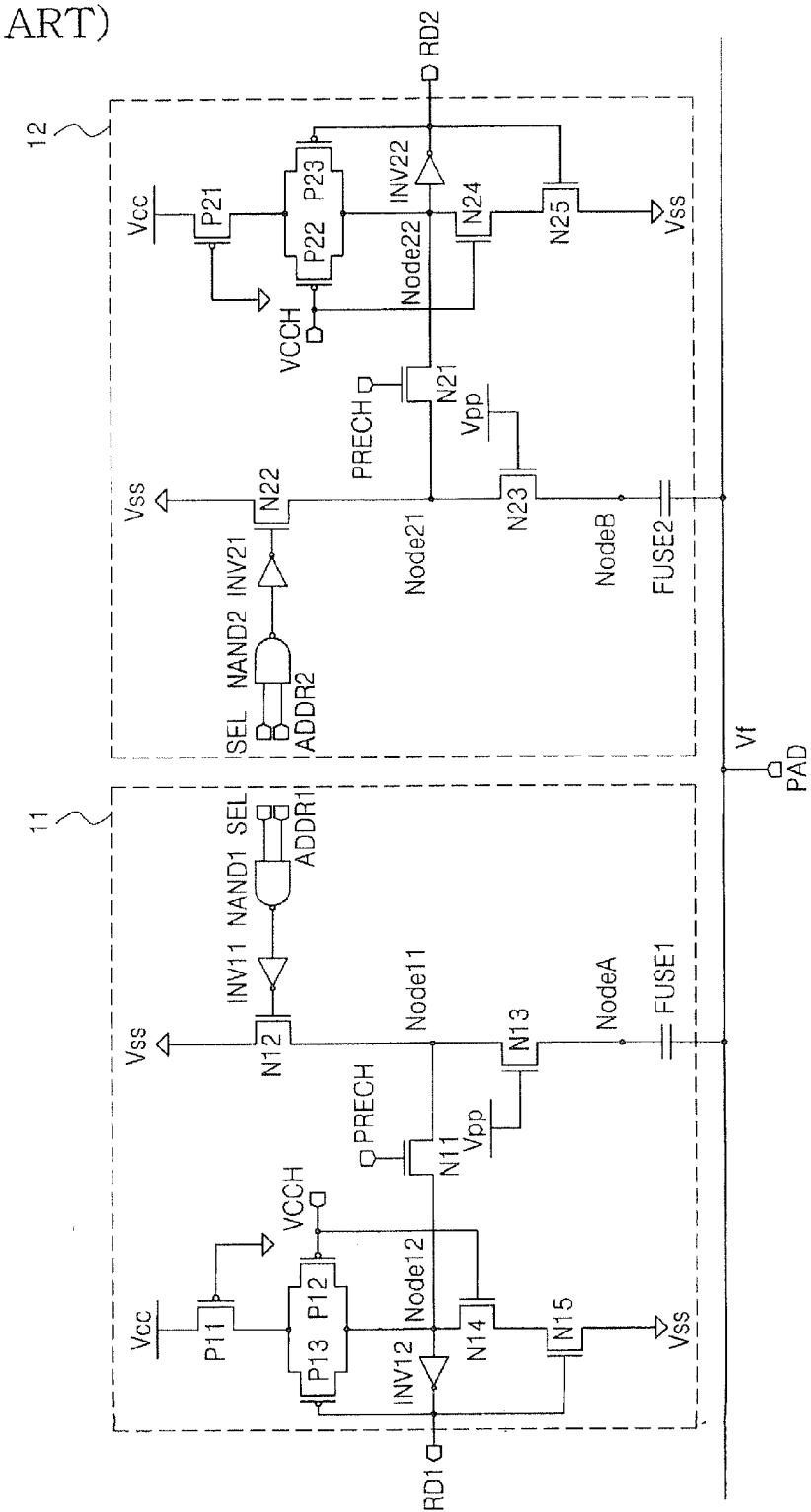
FIG. 2 is a circuit diagram that illustrates a conventional antifuse circuit.
Figure 3:
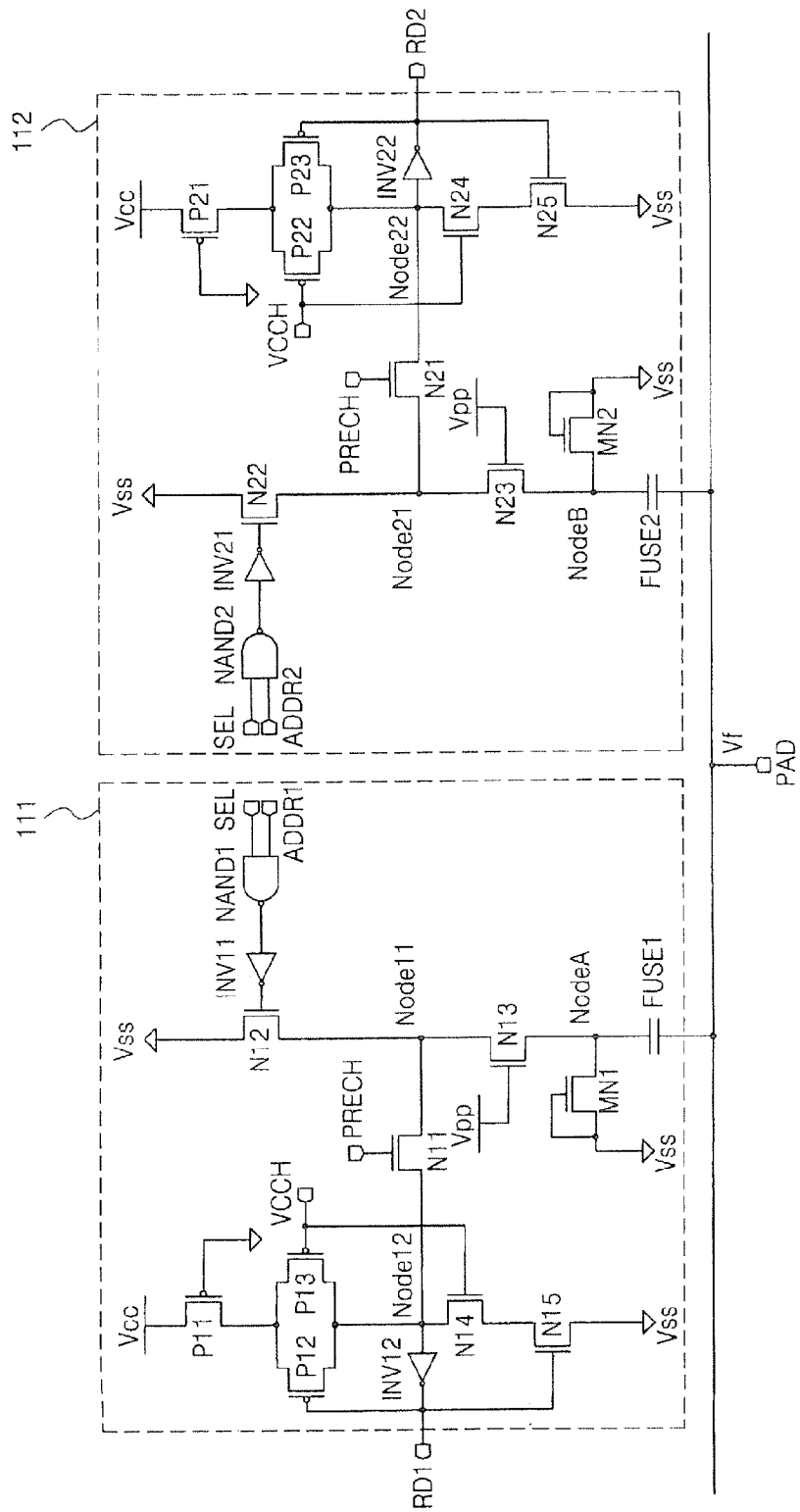
FIG. 3 is a circuit diagram that illustrates an antifuse circuit according to some embodiments of the present invention.

FIG. 3 is a circuit diagram of an antifuse circuit according to some embodiments of the present invention. Similar to FIG. 2, FIG. 3 illustrates two antifuse circuits 111 and 112 among a plurality of antifuse circuits 10 corresponding to a row or column connected to a pad PAD to which a high voltage Vf is applied from the high voltage generator 30 of FIG. 1.

In FIG. 3, it is assumed that only a first antifuse FUSE1 of the first antifuse circuit 111 is fused. The antifuse circuits 111 and 112 may have NMOS transistors N11 and N21 that are operable as a switch having one end that may be a fuse part and another end that may be a latch part.

The NMOS transistors N11 and N21 may switch between their fuse nodes Node11 and Node21 and latch nodes Node12 and Node22 in response to a power-up signal PRECH. The power-up signal PRECH increases as a power voltage Vcc increases upon initial power application, but when the power voltage Vcc reaches a certain level and is maintained, the power-up signal PRECH is constantly maintained at the power voltage Vcc for a predetermined time. Accordingly, when the power voltage Vcc is applied, the power-up signal PRECH increases and then is maintained at the certain level for a predetermined time, and, thus, current may flow from the latch nodes Node12 and Node22 to the fuse nodes Node11 and Node21.

A program mode selection signal SEL and address signals ADDR1 and ADDR2 are applied to the fuse parts. A semiconductor memory device activates the program mode selection signal SEL to perform a repair procedure after a defective memory cell is detected through testing. The program mode selection signal SEL may be applied to the plurality of antifuse circuits 111 and 112 at the same time so as to perform programming operations. Meanwhile, the semiconductor memory device activates the address signal ADDR1 of the antifuse circuit 111 of the defective memory cell detected by the testing and targeted for replacement. That is, the program mode selection signal SEL is activated during the programming operation so as to be applied to all antifuse circuits 111 and 112, and the address signals ADDR1 and ADDR2 are selectively activated to choose only an antifuse circuit that is to be programmed among the plurality of antifuse circuits 111 and 112.

The program mode selection signal SEL is activated in the programming operation, and the first address signal ADDR1 is also activated because the first antifuse FUSE1 is to be fused. However, the second address signal ADD R2 is not activated because there is no fusing to be performed in response thereto. Here, an activated signal may have a logic high level.

The high level program mode selection signal SEL and the first address signal ADDR1 are input to a NAND gate NAND1, which outputs a low level signal. The low level signal is converted back into a high level signal by a first inverter INV1 and is applied to a gate terminal of an NMOS transistor N12. The NMOS transistor N12 is turned on in response to the high level signal. The second address signal ADDR2 is applied at a low level, and, thus, a low level signal is applied to a gate terminal of an NMOS transistor N22 and the NMOS transistor N22 is turned off.

Figure 1:
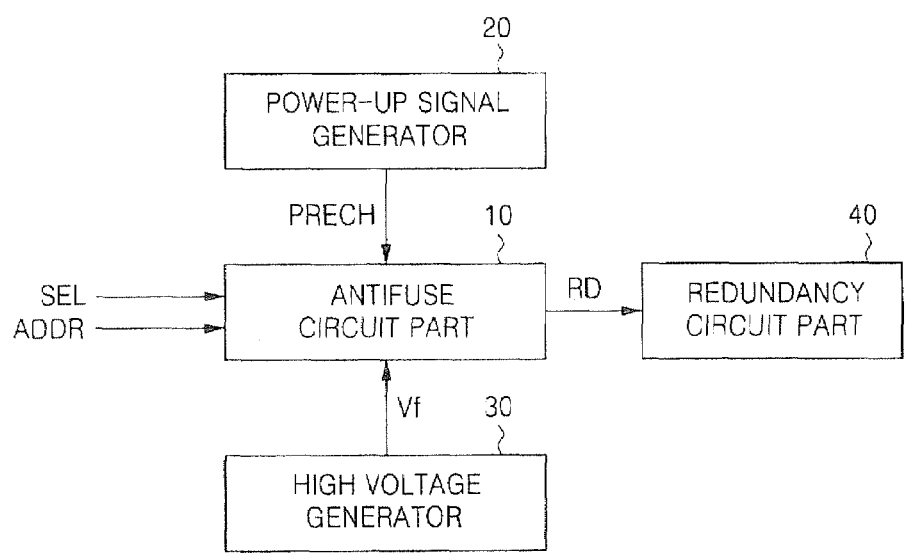
FIG. 1 is a block diagram of a conventional repair circuit having an antifuse circuit.

In the meantime, when a high voltage Vf is applied from the high voltage generator 30 of FIG. 1 to the pad PAD, the high voltage Vf is applied to one end of all antifuses FUSE1 and FUSE2 connected to the pad PAD. The NMOS transistor N12 is turned on by the program mode selection signal SEL and the first address signal ADDR1, and an NMOS transistor N13 is always turned on because a boost voltage Vpp is applied to a gate terminal so that an A node NodeA is driven to a ground or reference voltage level. As a result, a high voltage is applied between both ends of the first antifuse FUSE1, and, thus, the first antifuse FUSE1 is fused. Because the NMOS transistor N22 of the second antifuse circuit 12 is turned off in response to the low level second address signal ADDR2, the voltage applied between both ends of the second antifuse FUSE2 is not high. Accordingly, the second antifuse FUSE2 is not fused. The high voltage Vf is applied to the pad PAD during the fusing operation, and a ground or reference voltage Vss is applied thereto when the fusing operation is not performed.

Here, NMOS transistors N13 and N23 connected between the fuse node Node11 and the A node NodeA, and between the fuse node Node21 and the B node NodeB, function to prevent or reduce damage to gate oxide layers of the transistors comprising each of the antifuse circuits 11 and 12, even if a high voltage is applied to the pad PAD during programming operations. That is, the NMOS transistors N13 and N23 may function as protection transistors.

If the high voltage Vf generated from the high voltage generator 30 is applied through the pad PAD and supplied to the first antifuse circuit FUSE1 of the first antifuse circuit 111 in a programming operation, then the high voltage is also applied to one end of the second antifuse FUSE2 of the second antifuse circuit 112 as well as the first antifuse circuit 111. However, because the NMOS transistor N22 of the second antifuse circuit 112 is not turned on, the B node NodeB is in a floating state, and, thus, a voltage level of the B node NodeB increases from an initial value Vcc-Vth due to a coupling effect.

In contrast to the conventional circuit of FIG. 2, protection transistors MN1 and MN2 added in FIG. 3 have drain terminals connected to the A node NodeA and the B node NodeB, and gate and source terminals connected to the ground or reference voltage Vss. Thus, the transistors MN1 and MN2 are configured to remain in a turned off state. However, when the voltage of the B node NodeB increases to more than a predetermined voltage level due to a coupling effect, a punch-through breakdown phenomenon occurs in the protection transistor MN2. The punch-through breakdown phenomenon occurs when junction depletion regions of a source and a drain meet in a MOS transistor and, in the case of a low concentration substrate or a short channel, a relatively large amount of current may flow abruptly between the source and drain.

That is, when the voltage level of the B node NodeB increases to more than a predetermined voltage level, the protection transistor MN2 may maintain the voltage level of the B node NodeB substantially constant because of the large current flow due to the punch-through breakdown phenomenon. The voltage level, which can cause the punch-through breakdown phenomenon, may be controlled by adjusting the thickness of the transistor or ion-implantation concentration, etc., in fabricating the protection transistors MN1 and MN2.

Unlike the protection transistor MN2 that causes the punch-through breakdown phenomenon by connecting to the B node NodeB, current does not generally flow in the protection transistor MN1 connected to the A node NodeA because the NMOS transistor N12 is turned on and, thus, the voltage level of the fuse node Node11 is low.

In the antifuse circuits 111 and 112 in which the first antifuse FUSE1 is fused but the second antifuse FUSE2 is not fused, the latch part precharges the latch nodes Node21 and Node22 with the power voltage Vcc and then latches the voltages thereof.

First, the latch part precharges the latch nodes Nodes21 and Node22 as the power voltage Vcc increases upon application of the power supply. Here, a power stabilization signal VCCH is maintained at a low level during the increase in the power voltage Vcc, and when the power voltage Vcc reaches a certain level and is maintained, the power stabilization signal VCCH transitions to a high level. Upon initial application of power, the power stabilization signal VCCH is at a low level so that a current path is formed by PMOS transistors P11, P21, P12 and P22. Also, the power-up signal PRECH increases as the power voltage Vcc increases, and, thus, current flows toward the fuse nodes Node11 and Node21 through the PMOS transistors P11, P21, P12 and P22 and the NMOS transistors N11 and N21. Gate terminals of the NMOS transistors N13 and N23 are connected to a boost voltage Vpp, and, thus, current flows to the antifuses FUSE1 and FUSE2.

Because the first antifuse FUSE1 of the first antifuse circuit 111 is fused so as to have a relatively small resistance, the current through the fuse node Node11 flows to the pad PAD through the first antifuse FUSE1 so that a voltage of the fuse node Node11 does not increase beyond a predetermined level. The NMOS transistor N11 connects the fuse node Node11 and the latch node Node12 in response to the power-up signal PRECH, and, thus, the voltage of the latch node Node12 decreases according to the voltage of the fuse node Node11. When the power voltage Vcc is stable, the power stabilization signal VCCH is at a high level so that the PMOS transistor P12 is tuned off and an NMOS transistor N14 is tuned on. As the voltage of the latch node Node12 decreases, a second inverter INV12 outputs a high level signal, and, thus, an NMOS transistor N15 is turned on and the PMOS transistor P13 is turned off. As a result, the voltage at the latch node Node12 stabilizes at a low level. Because the NMOS transistor N14 is turned on, it can be seen that the second inverter INV12, the PMOS transistor P13, and the NMOS transistor N15 comprise a latch circuit.

Because the second antifuse FUSE2 of the second antifuse circuit 112 is not fused and, thus, has a relatively large resistance, the current through the fuse node Node 21 does not flow to the pad PAD through the second antifuse FUSE2. Accordingly, the voltage of the fuse node Node21 increases. The NMOS transistor N21 connects the fuse node Node21 and the latch node Node22 in response to the power-up signal PRECH, and, thus, the voltage of the latch node Node22 increases according to the voltage of the fuse node Node21. When the power voltage Vcc is stable, the power stabilization signal VCCH is at a high level so that the PMOS transistor P22 is turned off and an NMOS transistor N24 is turned on. As the voltage of the latch node Node22 increases, a second inverter INV22 outputs a low level signal, and, thus, an NMOS transistor N25 is turned off and the PMOS transistor P23 is turned on. As a result, the voltage at the latch node Node22 stabilizes at a high level. Because the NMOS transistor N24 is tuned on, it can be seen that the second inverter INV22, the PMOS transistor P23, and the NMOS transistor N25 comprise a latch circuit.

Although exemplary operations are described herein as being performed in a certain sequence for convenience; in alternative embodiments, the sequence may be changed or the operations may be performed substantially simultaneously.

When the antifuse FUSE1 of the antifuse circuit 111 is fused and the antifuse FUSE2 of the second antifuse circuit 112 is not fused by a programming operation, the first antifuse circuit 111 outputs a high level redundancy signal RD1, and the second antifuse circuit 112 outputs a low level redundancy signal RD2.

Figure 4:
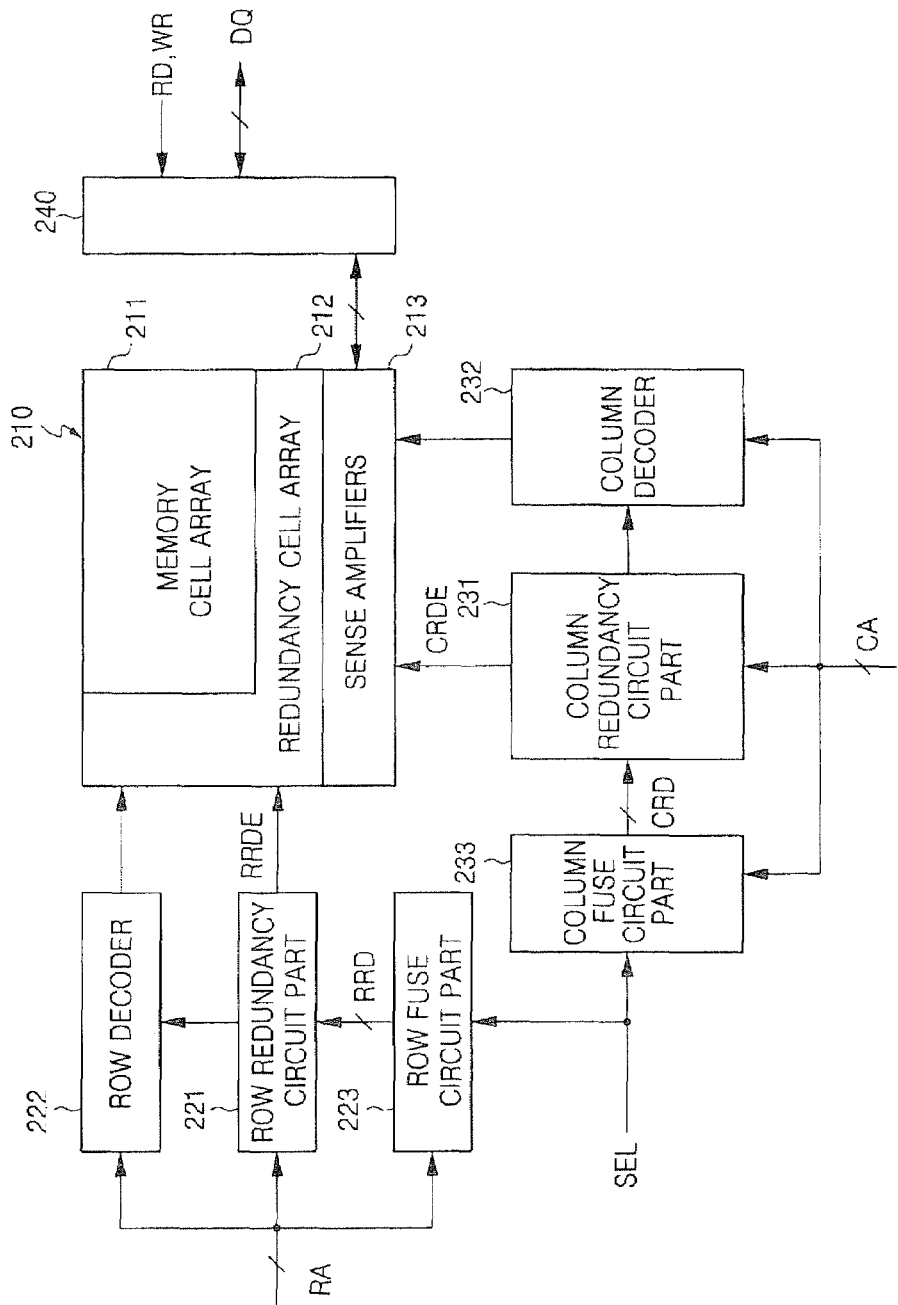
FIG. 4 is a block diagram of a semiconductor memory device having an antifuse circuit according to some embodiments of the present invention.

FIG. 4 is a block diagram of a semiconductor memory device that includes an antifuse circuit according to some embodiments of the present invention.

In FIG. 4, a memory cell array block 210 comprises a memory cell array 211 that includes memory cells that store data between a plurality of word lines and a plurality of bit lines, a redundancy cell array 212 that includes redundancy memory cells connected between a plurality of redundancy word lines and a plurality of redundancy bit lines to replace defective memory cells of the memory cell array, and a plurality of sense amplifiers 213 that sense and amplify the data of the memory cell array 211 and the redundancy cell array 212. The redundancy cell array 212 includes a redundancy row for replacing an entire row of the memory cell array that contains a defective memory cell, and a redundancy column for replacing an entire column that contains a defective memory cell. While both a redundancy row and column are shown in FIG. 4, other embodiments may include only a redundancy row or a redundancy column.

The defective memory cell is detected by testing the memory cell array 211 and is replaced with the memory cell of the redundancy memory cell array 212. To replace the defective memory cell with the memory cell of the redundancy memory cell array 212, a program mode selection signal SEL is applied to a row fuse circuit part 223 and a column fuse circuit part 233 so as to repair the semiconductor memory device. The program mode selection signal SEL may be set by a mode register set MRS, etc. When the program mode selection signal SEL is activated in the programming operation and an address signal for an address to be replaced is applied, a selected antifuse of the row fuse circuit part 223 or the column fuse circuit part 233 is fused.

Subsequently, when a row address RA is output from an address register (not illustrated) during normal operation of the semiconductor memory device, the row address RA is applied to each of a row redundancy circuit part 221 and a row decoder 222. The row fuse circuit part 223 comprises a plurality of antifuse circuits 111 and 112 and is configured to determine whether an antifuse is fused in response to the power-up signal PRECH and the power stabilization signal VCCH in normal operation, and, if the antifuse is fused, to activate and output a row redundancy signal RRD to row redundancy circuit part 221. The row redundancy circuit part 221 receives each of the row redundancy signals RRD from the plurality of antifuse circuits of the row fuse circuit part 223, compares the row redundancy signals RRD with the row address RA, selects a row of the redundancy memory cell array 212 in response to the row redundancy signals RDD, and outputs a row redundancy enable signal RRDE to the row decoder 222 to prevent the row decoder 222 from selecting a row of the memory cell array 211. If the antifuse is not fused, because a row redundancy signal RRD for a corresponding row address RA is not activated, the row redundancy circuit part 221 does not select the row of the redundancy memory cell array 212, and the row decoder 222 that receives the row address RA selects the row of the memory cell array 211.

In the same manner, when a column address CA is output from an address register (not illustrated), a column redundancy circuit part 231 and a column decoder 232 each receive the column address CA. A column fuse circuit part 233 comprises a plurality of antifuse circuits 111 and 112 and is configured to determine whether the antifuse is fused in response to the power-up signal PRECH and the power stabilization signal VCCH in normal operation, and, if the antifuse is fused, to activate and then output a column redundancy signal CRD to the column redundancy circuit part 231. The column redundancy circuit part 231 receives the column redundancy signal CRD from each of the antifuse circuits of the column fuse circuit part 233, compares the column redundancy signal CRD with the column address CA, activates a corresponding sense amplifier of a plurality of sense amplifiers 213 to select a column of the redundancy memory cell array 212 in response to the column redundancy signal CRD for a corresponding column address CA, and outputs a column redundancy enable signal CRDE to the column decoder 232 to prevent the column decoder 232 from selecting the column of the memory cell array 211. If the antifuse is not fused, because the column redundancy signal for the corresponding column address CA is not activated, the column redundancy circuit part 231 does not select the column of the redundancy memory cell array 212, and the column decoder 232 that receives the column address CA selects the sense amplifier 213 for the column of the memory cell array 211.

In response to a read signal RD applied from an instruction decoder (not illustrated), the sense amplifier 213 detects and amplifies data DQ of the memory cell connected between a word line or a redundancy word line selected by the row redundancy circuit part 221 or the row decoder 222, and a bit line or a redundancy bit line selected by the column redundancy circuit part 231 or the column decoder 232, and then a data input/output part 240 outputs the data DQ. In response to a write signal WR applied to the instruction decoder, the data input/output part 240 stores the data DQ transmitted from outside the device in a selected memory cell.

An antifuse circuit and a semiconductor memory device that uses the same, according to some embodiments of the present invention, includes a protection transistor that has grounded gate and source terminals and a drain terminal connected to one end of an antifuse whose other end is connected to a pad. Thus, according to some embodiments of the present invention, when a high voltage is applied to fuse an antifuse circuit selected from the antifuse circuits sharing the pad, it may be possible to prevent an increase in a voltage level at one end of an antifuse, which is not selected, due to a coupling effect. As a result, an antifuse circuit, according to some embodiments of the present invention, may reduce stress on internal transistors, thereby protecting them from damage.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

That which is claimed:

1. A semiconductor device, comprising:
   a fuse part including an antifuse connected between a first common node to which a high voltage that is higher than an internal boost voltage is applied and a first node, the fuse part being enabled in response to a program mode selection signal and an address signal so as to fuse the antifuse in response to the high voltage applied to the first common node and to set a voltage level of a second node;
   a latch circuit that is configured to latch an output signal responsive to the voltage level of the second node when the fuse part is in a fused state; and
   a protection circuit that is configured to lower a voltage level at the first node when the fuse part is not enabled and the high voltage is applied to the first common node.

2. The semiconductor device according to claim 1, further comprising a pad connected to the first common node to receive the high voltage.

3. The semiconductor device according to claim 1, wherein the fuse part comprises:
   a first NMOS transistor connected between the second node and a second common node, the first NMOS transistor being enabled responsive to the program mode selection signal and the address signal;
   the antifuse that is configured to connect the first common node and the first node responsive to the high voltage applied to the first common node and the enabled first NMOS transistor; and
   a second NMOS transistor connected between the first and second nodes, that is configured to transmit voltages up to a first predetermined voltage level when the internal boost voltage is applied to a gate terminal thereof.

4. The semiconductor device according to claim 3, wherein the protection circuit is a third NMOS transistor having source and gate terminals connected to the second common node and a drain terminal connected to the first node, and is operable to enter a punch-through breakdown state responsive to a voltage exceeding a second predetermined voltage level applied to the drain terminal.

5. The semiconductor device according to claim 4, wherein the latch circuit comprises:
   a switch transistor that connects the second node and a third node responsive to a power-up signal; and
   a latch part that is configured to latch the output signal responsive to a power stabilization signal and a voltage level at the third node.

6. The semiconductor device according to claim 5, wherein a voltage level of the power-up signal increases according to a level of an applied power voltage, and the voltage level of the power-up signal is maintained at a high level for a time period when the power voltage stabilizes and then transitions to a low level.

7. The semiconductor device according to claim 5, wherein the latch part further comprises:
   an activation part comprising a first PMOS transistor and a fourth NMOS transistor connected at the third node in series which activate the latch part responsive to the power stabilization signal;
   an inverter that generates the output signal at an output node by logically inverting the voltage level at the third node; and
   an output latch part comprising a second PMOS transistor and a fifth NMOS transistor having respective gate terminals connected to the output node and receiving the output signal at their gates and latch the output signal together with the inverter.

8. The semiconductor device according to claim 7, wherein the power stabilization signal transitions to a high level responsive to the applied power voltage.

9. A semiconductor memory device, comprising:
- a memory cell array that comprises memory cells connected between a plurality of word lines and a plurality of bit lines;
- a redundancy memory cell array that comprises redundancy memory cells connected between a plurality of redundancy word lines and a plurality of redundancy bit lines;
- a plurality of fuse circuit parts including an antifuse connected between a first common node to which a high voltage that is higher than an internal boost voltage is applied and a first node, each of the fuse circuit parts being enabled in response to a program mode selection signal and an address signal so as to fuse the respective antifuse in response to the high voltage applied to the first common node and to set a voltage level of a second node, each of the fuse circuit parts being further enabled to output a redundancy signal in response to the voltage level of the second node;
- a plurality of protection circuits associated with the plurality of fuse circuit parts, respectively, each of the protection circuits being configured to lower a voltage level at the first node when the fuse circuit part is not enabled and the high voltage is applied to the first common node;
- a redundancy circuit part that is configured to select a corresponding redundancy word line or redundancy bit line of the redundancy memory cell array responsive to the address signal and the redundancy signal, and to output a redundancy enable signal; and
- a decoder that is configured to select a corresponding word line or bit line of the memory cell array responsive to the address signal, and being disabled responsive to the redundancy enable signal.

10. The semiconductor memory device according to claim 9, further comprising a pad connected to the first common node to receive the high voltage.

11. The semiconductor memory device according to claim 9, wherein the fuse circuit part comprises:
- a fuse part including the antifuse, that is configured to connect the first node and a second common node in response to the program mode selection signal and the address signal; and
- a latch part that is configured to latch and output the redundancy signal responsive to the voltage level of the second node.

12. The semiconductor memory device according to claim 11, wherein the fuse part comprises:
- a first NMOS transistor connected between the second node and the second common node and the first NMOS transistor being enabled responsive to the program mode selection signal and the address signal;
- the antifuse that is configured to connect the first common node and the first node responsive to the high voltage applied to the first common node and the enabled first NMOS transistor; and
- a second NMOS transistor connected between the first and second nodes that is configured to transmit voltages up to a first predetermined voltage level when the internal boost voltage is applied to a gate terminal thereof.

13. The semiconductor memory device according to claim 12, wherein each of the protection circuits comprises a third NMOS transistor having source and gate terminals connected to the second common node and a drain terminal connected to the first node, and is operable to enter a punch-through breakdown state responsive to a voltage exceeding a second predetermined voltage level applied to the drain terminal.

14. The semiconductor memory device according to claim 9, further comprising:
- a plurality of sense amplifiers connected to the plurality of bit lines and/or the plurality of redundancy bit lines configured to sense and amplify data of the memory cells and/or the redundancy memory cells; and
- a data input/output part configured to output the data received from the plurality of sense amplifiers responsive to a read signal, and configured to input data to the plurality of sense amplifiers responsive to a write signal.

* * * * *